US009362442B2

(12) United States Patent
Kacandes (10) Patent No.: US 9,362,442 B2
(45) Date of Patent: *Jun. 7, 2016

(54) SYSTEM AND METHOD OF ASSEMBLING STRUCTURAL SOLAR PANELS (71) Applicant: Thomas J. Kacandes, New Paltz, NY (US)

(72) Inventor: Thomas J. Kacandes, New Paltz, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/536,720

(22) Filed: Nov. 10, 2014

(65) Prior Publication Data

US 2015/0059158 A1 Mar. 5, 2015

Related U.S. Application Data (62) Division of application No. 13/738,411, filed on Jan. 10, 2013, now Pat. No. 8,910,433.

(51) Int. Cl.
*E04D 13/18* (2014.01)
*H01L 31/18* (2006.01)
*E04D 13/04* (2006.01)
*H02S 20/23* (2014.01)
*H01L 31/048* (2014.01)
*F24J 2/46* (2006.01)
*F24J 2/52* (2006.01)

(52) U.S. Cl.
CPC ............ *H01L 31/18* (2013.01); *E04D 13/0481* (2013.01); *F24J 2/465* (2013.01); *F24J 2/4614* (2013.01); *F24J 2/5205* (2013.01); *F24J 2/5209* (2013.01); *F24J 2/5254* (2013.01); *H01L 31/048* (2013.01); *H02S 20/23* (2014.12); *F24J 2002/5213* (2013.01); *Y02B 10/12* (2013.01); *Y02B 10/70* (2013.01); *Y02E 10/47* (2013.01); *Y02E 10/52* (2013.01); *Y10T 29/49355* (2015.01); *Y10T 29/49826* (2015.01); *Y10T 29/49959* (2015.01)

(58) Field of Classification Search
CPC ........ Y02B 10/12; Y02B 10/20; Y02B 10/50; Y02B 10/70; Y10T 29/49355; Y10T 29/49826; Y10T 29/49959; Y02E 10/47; Y02E 10/52; H01L 31/18; H01L 31/048; H02S 20/23; E04D 13/0481
USPC .......... 52/173.3; 126/621, 622, 623; 136/244, 136/246, 251, 259; 248/237
See application file for complete search history.

(56) References Cited

U.S. PATENT DOCUMENTS

| | | | | |
|---|---|---|---|---|
| 6,959,517 | B2 * | 11/2005 | Poddany et al. | ............. 52/173.3 |
| 7,866,099 | B2 * | 1/2011 | Komamine | ............ F24J 2/5207 24/290 |
| 8,136,311 | B2 * | 3/2012 | Liu | ............................. 52/173.3 |
| 2003/0015637 | A1 * | 1/2003 | Liebendorfer | ................ 248/237 |
| 2009/0019796 | A1 * | 1/2009 | Liebendorfer | ............... 52/173.3 |
| 2013/0091786 | A1 * | 4/2013 | DuPont et al. | .............. 52/173.3 |
| 2013/0192150 | A1 * | 8/2013 | DuPont et al. | .............. 52/173.3 |

* cited by examiner

*Primary Examiner* — James Buckle, Jr.
(74) *Attorney, Agent, or Firm* — Lawrence D. Cutter (57) ABSTRACT

A modular assembly of solar panels is held together in a rigid fashion through the use of two J-channels arranged on either side thereof in oppositely facing directions. Brackets hold these J-channels to flanges on the underside of the solar panels. In the argot of solar panel installation, the J-channels extend in the north-south direction. Between each solar panel there is disposed a liquid collecting pan extending in the east-west direction. This collecting pan also acts as a clip providing both a structural and electrical connection between adjacently disposed solar panels in a column assembly which is rendered capable of installation as a single unit from the ground.

10 Claims, 11 Drawing Sheets

SYSTEM AND METHOD OF ASSEMBLING STRUCTURAL SOLAR PANELS

CROSS-REFERENCE TO RELATED APPLICATIONS

This application contains subject matter which is related to the subject matter of the following application, which is owned by the same person as this application. The listed application is hereby incorporated herein by reference in its entirety: Application Ser. No. 13/738,411 filed on Jan. 10, 2013 of which this is a divisional application.

TECHNICAL FIELD

The present invention is generally directed to a system and method of assembling solar panels. More particularly, the present invention is directed to the utilization of solar panels as part of a roof structure, this being in contrast to the use of solar panels that are simply mounted on an existing roof structure. Even more particularly, the present invention is directed to a system and method of assembling individual solar panels on the ground, on-site or in a facility for prefabrication so that they may be lifted into place as a multi-panel assembly.

BACKGROUND OF THE INVENTION

While there have been many proposed methods for mounting solar panels on a roof, there does not appear to be any solar panel mounting system in which the solar panels themselves are assembled in a manner which allows their use as a roof structure or as part of a roof structure. Prior art designs in this area have required pre-existing roof structures for the mounting of solar panels onto established surfaces and/or decking material.

It is noted also that, in many of the existing installation techniques, individual solar panels are lifted into place. In many such designs the panels are individually attached to the roof structure and provide absolutely no structural integrity or reinforcement. The handling of individual panels is difficult and time-consuming particularly in that the installers are working in an elevated environment often on a structure having a significant slope, the slope being either required or desired in order to maximize insolation.

Accordingly, it is seen that it is desired to employ solar panels as part of a roof structure (again, for emphasis, in contrast to installation on an existing roof). It is desirable that the solar panels be assembled in a modular structure which may be lifted as a single unit for installation. Accordingly, it is desirable that the modular structure comprising several solar panels exhibit sufficient rigidity for being lifted into place as a single unit. However, one of the significant considerations that one encounters when one attempts to employ solar panels as a roof structure is that the solar panels must now perform the functions that are normally assigned to the roof itself. Most particularly, a completed solar panel installation should be capable of providing water drainage. Moreover, water drainage systems deployed should address the problem of any gaps that exist between panels in either the east-west or the north south directions. See the discussion below for the intended meaning of these directions. Desired water drainage systems should also address the fact that solar panel installations are intended for exterior, all weather, multi-decade functioning.

It should be noted, however, that while the solar panel assemblies of the present invention are particularly designed and intended for use as an integral part of a roof structure, the solar panel assemblies described herein are also deployable on existing roof structures with only a slight modification.

It is useful at this point to consider some of the descriptive nomenclature that is used in the field of solar energy installation. More particularly, as used in the present invention, the term "solar panel" refers to either a panel designed to provide electrical energy (photovoltaic panels) or to provide thermal energy (solar thermal panels). While the present invention has been designed with photovoltaic panels in mind, it is equally applicable to systems and methods for installing many types of solar thermal panels.

Additionally, it is noted that, for purposes of efficiency, solar panels of either variety are desirably oriented in a southerly direction. While the present invention is completely usable with square solar panels, it is noted that most solar panels produced exhibit a certain aspect ratio. That is, most solar panels have a length to width ratio other than 1. This provides such panels with the option of being mounted in either a so-called "portrait" or so-called "landscape" orientation. As a result, most installations of solar panels result in their longer edges being roughly aligned in a north to south direction. The other edges are naturally oriented in a roughly east to west direction. Accordingly, the present application is seen to refer to these edges as being the north-south edge or the east-west edge. These designations are solely for convenience and for more easily relating the use of the present invention to the more standard configurations of solar panel installation. The use of these terms is not in any way intended to suggest that the solar panels employed in the present invention are necessarily required to face in any particular direction or that they be mounted in either a portrait or landscape orientation. Reference to east-west and north-south directions is based on the usually desired arrangement in which south facing arrays are employed, thus making east-west seams the ones that one are typically described as being horizontal. Clearly, in the southern hemisphere, the generally desired orientation is to the north.

US patent application 2001/0302587 submitted by McClellan et al. and filed on Jun. 10, 2010 also describes a system for mounting solar panels in a manner which is intended to address the problem of water drainage. It is noted in that this configuration requires the prior placement of their north to south channels. This is a significant limitation in that it means that their solar panels must be lifted into place individually. There is also a significant limitation in that their north to south channels comprise a single integral structure. From one perspective, it can be said that, while this particular patent application employs a U-shaped channel, the double J-shaped configuration of the present invention effectively comprises a W-shaped channel. It would also appear that, in this patent application, sealing against water is provided above the plane of the solar panels. Moreover, it is noted that their east-west drainage pan does not in any way function as a clip nor is it seen to provide any structural connection ("The east-west gutter system is strictly in place to catch any rainwater."). It is also noted that this particular patent application attaches solar panels to their channels in a manner which does not in any way take advantage of solar panels having inwardly disposed flanges extending from their frames on their undersides. In terms of manufacturing, it is also noted that the system described in this patent application requires the utilization of a relatively bulky, expensive piece of extruded aluminum.

From the above, it is therefore seen that there exists a need in the art to overcome the deficiencies and limitations described herein and above.

SUMMARY OF THE INVENTION

The shortcomings of the prior art are overcome and additional advantages are provided through the use of a solar panel module comprising: an assembly of solar panels comprising a plurality of solar panels arranged in a row, the solar panels having frames with inwardly directed, substantially horizontal frame edges on their undersides. A pair of J-channel supports, disposed in mirror image fashion, on either side of the solar panel assembly provides rigidity for installation. The J-channel supports are affixed via brackets to horizontal frame edges. The solar panel assembly is thus supported on either side by J-channel supports forming a substantially rigid structure which is installable as a single unit. When disposed adjacent to a similar assembly of solar panels and joined together to them, the now oppositely-disposed J-channel supports form an essentially W-shaped channel in which rainwater is not only drained away but in which it is also kept at a distance below and away from the solar panels.

In another aspect, the solar panel modules described above are assembled together to form an integral roof structure.

Accordingly, it is an object of the present invention to take advantage of the frame structure associated with conventional, production model solar panels.

It is another object of the present invention to provide an efficient means of attaching a module's frame to adjacent modules above and below so that it becomes arranged in a column running in the north-south direction in a finished array of solar modules.

It is yet another object of the present invention to provide sturdy mechanical attachment to any structure that provides a set of attachment and support elements such as roof purlins arranged in a plane tilted above the horizontal, but does not require any other surface or decking material connecting these structural supports, thereby allowing the solar modules and attachment system to act as a structural roof element.

It is a still further object of the present invention to allow a variable number of solar modules (generally from 2 to about 10) to be joined together into a north-south column prior to any other installation steps while at ground level and/or indoors.

It is still another object of the present invention to reduce the need for laborers working on ladders or other lift equipment during the installation on site, thus improving safety and reducing cost, while also creating fewer individual elements requiring transportation, handling, and lifting into place.

It is yet another object of the present invention to provide each unitized north-south column of modules with an electrical grounding structure between these modules, thus reducing the number of ultimate connection points that must be further connected to ground.

It is a still further object of the present invention to permit a single machine operator to perform all of the lifting and placing tasks to transfer unitized columns of modules from a delivery truck to their final spot on the structure.

It is yet another object of the present invention to permit a single installer to quickly perform the final installation steps of joining unitized columns of modules to the adjacent column unit and to the support structure below entirely from underneath the attachment plane of the structure, thus eliminating any climbing above the attachment plane as is the case in most conventional roof mounted solar installations and thus also keeps the installer protected from the movement path of the unitized column of modules as they are moved into place.

It is also an object of the present invention to provide the installer with several means of adjustment and alignment during and after the initial placement of unitized columns onto roof purlins so that the entire array can more easily be aligned and so as to better form a single plane, before final attachment to the structure below.

Lastly, but not limited hereto, it is an even further object of the present invention to provide a roof structure incorporating solar panels that are employed in a variety of architectural situations including carports, patio covers and the like; in short, the present invention provides a new architectural building element.

Additional features and advantages are realized through the techniques of the present invention. Other embodiments and aspects of the invention are described in detail herein and are considered a part of the claimed invention.

The recitation herein of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION

Conventionally framed flat-plate solar collectors or panels (including both photovoltaic and solar thermal types) most often have framing that is approximately "E" shaped in cross section with a top horizontal and middle horizontal that between them create a shallow cavity that receives the top plate of glass covering the panel and seals to it by means of tightly bonded adhesive that lines the cavity between the glass and frame, sealing out water ingress as the framing surrounds the glass on all four sides. Below this, a vertical portion of the frame extends down to a horizontal bottom lip that extends inwardly, toward the center of the panel. See reference numeral 102 in FIGS. 1, 2, 3 and 10. In the plane of this bottom horizontal, a plurality of attachment holes are arranged in a fashion so as to substantially uniformly carry the weight and other forces on the panel. Generally, there are four (4) to six (6) of these attachment holes per panel depending on its size. Other holes, generally smaller in diameter, provide connection for individual grounding of the assembly frame or for moisture drainage. These holes may be of any desired shape. These shapes are typically determined by the panel manufacturer.

Figure 1:
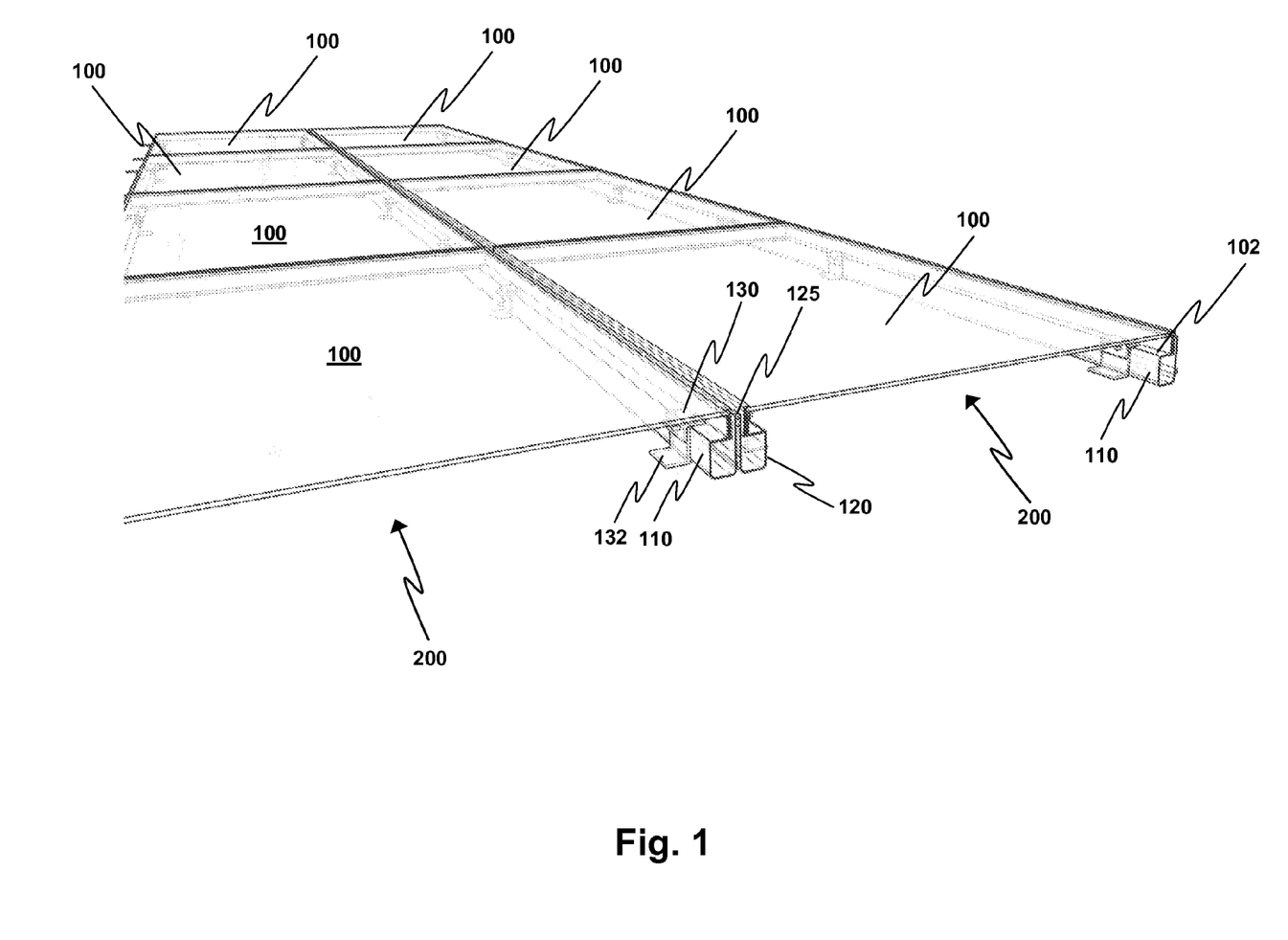
FIG. 1 is an isometric view of a roof structure comprising solar panels in accordance with the present invention.

Accordingly, it is now appropriate to direct attention to FIG. 1. This figure illustrates a portion of a roof structure in which a plurality of solar panels 100 are arranged in assemblies or columns. An assembly of such solar panels, connected by J-channels, in accordance with the present invention, is referred to as a module and is designated using reference numeral 200. As intended herein, these modules are intended to be installed as part of a roof as individual units in a progressive fashion until the array of desired size is formed. In accordance with the methods of the present invention, these assemblies are either formed in a factory or are formed on site. In either case, they are preferably delivered to the elevated structure as a single unit (a module). However, it is noted that assembly of the individual modules in situ is not precluded. In accordance with the methods of the present invention, these modules are created through the connecting together of panels, clips and J-channels, in a shop or on the ground, to facilitate this work. The completed modules are then are delivered to the elevated structure as a single unit.

Also of note in FIG. 1 is the presence of two back-to-back J-shaped channels 110 and 120. The bottom portion of J-shaped channels 110 and 120 are selected to be wider than the horizontally disposed flanges 102 on the bottom sides of solar panels 100. This sizing provides a mechanism for rainwater or other drainage into the J-shaped channels. Although not particularly visible in FIG. 1, horizontal flanges 102 are also present along all four sides of solar panel 100. This is more evident in FIG. 2. Being J-shaped, channels 110 and 120 both exhibit a short vertical portion (the left side of a letter "J") and a higher vertical portion oppositely disposed (the right side of a letter "J"). The J-channel is affixed to flange 102 primarily by means of bracket 130 and secondarily by through-bolt 134. This affixation may be carried out in any convenient manner including screws, nuts, bolts, pins, rivets and the like. Bracket 132 is provided for attachment to the rest of the architectural structure for which the invention in FIG. 1 is intended. In this respect, see FIG. 6. While brackets 130 and 132 are illustrated herein as being separate, these two brackets may be fabricated together as a single S-shaped unit.

Figure 2:
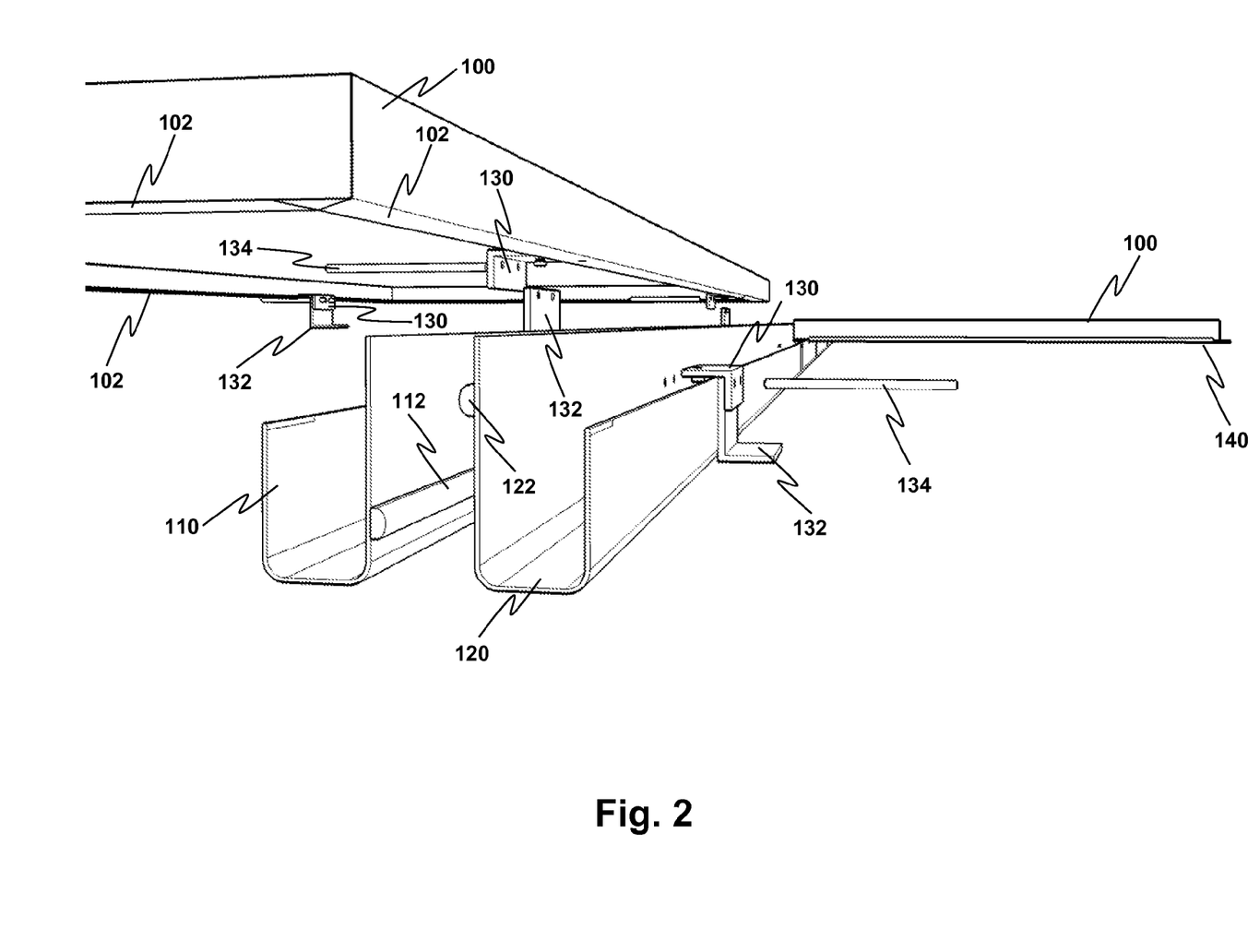
FIG. 2 is an isometric view more particularly illustrating the configuration of J-channels disposed in a mirror image fashion.

FIG. 1 is also useful for understanding the placement of adjacent panel modules 200. In particular, it is noted that the J-shaped channels 110 and 120 are disposed in a substantially mirror image fashion. Taken together, these support structures provide what may be described as a W-shaped drainage channel existing between adjacently disposed modules 200. In one embodiment of the present invention, polymeric strips 112 and 122 (as seen in FIG. 2) are provided on the exterior facing taller portions of J-shaped channels 110 and 120, respectively. As shown in FIG. 2 these polymeric strips are shown disposed in non-adjacent positions. However, primarily as a mechanism for reducing part count, a single strip may be disposed on these surfaces so as to lie directly opposite one another. It is these surfaces that provide a mechanism for the prevention of water leakage from the top of the panels to the volume beneath them. It is also possible to provide water leakage prevention by placing a single polymeric cap material over the top edges formed by the outer, taller vertical portions of the J-shaped channels. This polymeric cap is disposed at location 125 in FIG. 1. This polymeric cap is employable along with strips 112 and 122 or in place thereof.

Figure 3:
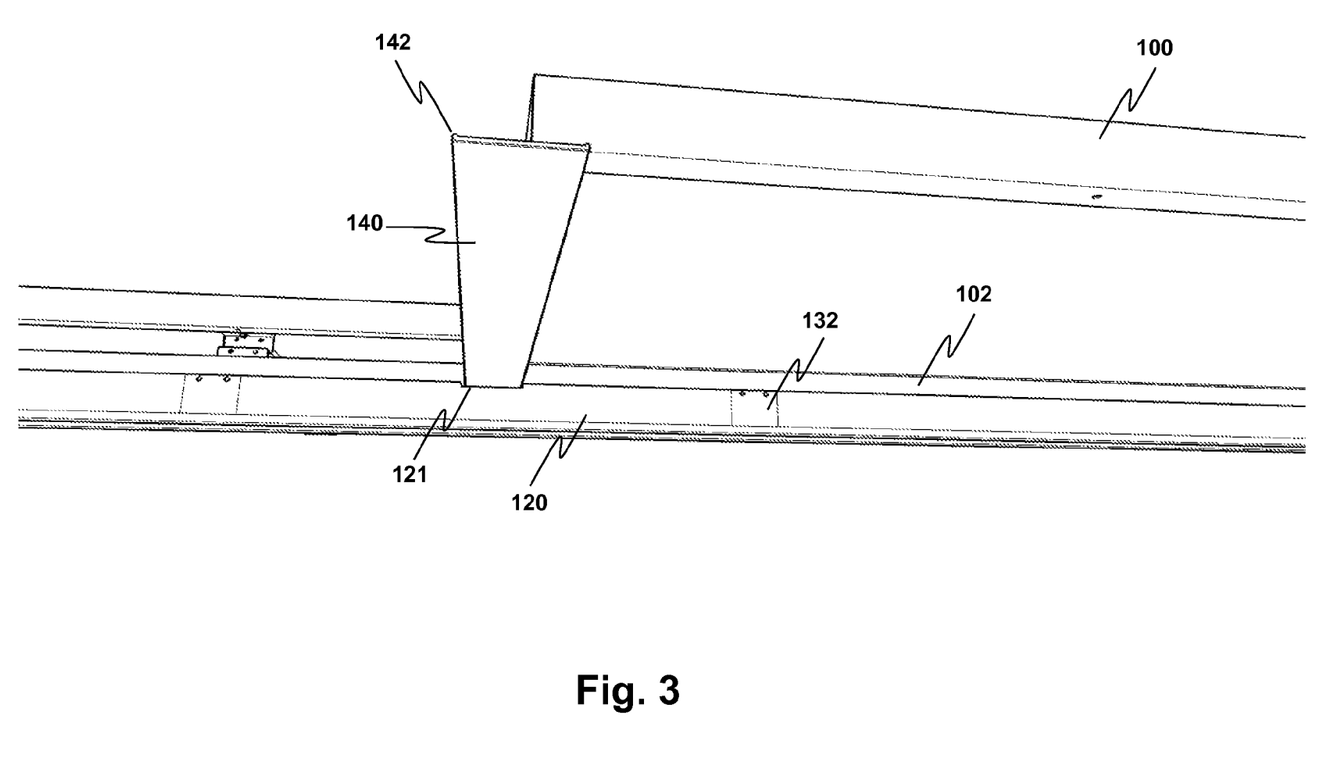
FIG. 3 is an isometric view of the underside of a portion of the roof structure of FIG. 1 more particularly illustrating an east-west clip or connecting pan.
Figure 4:
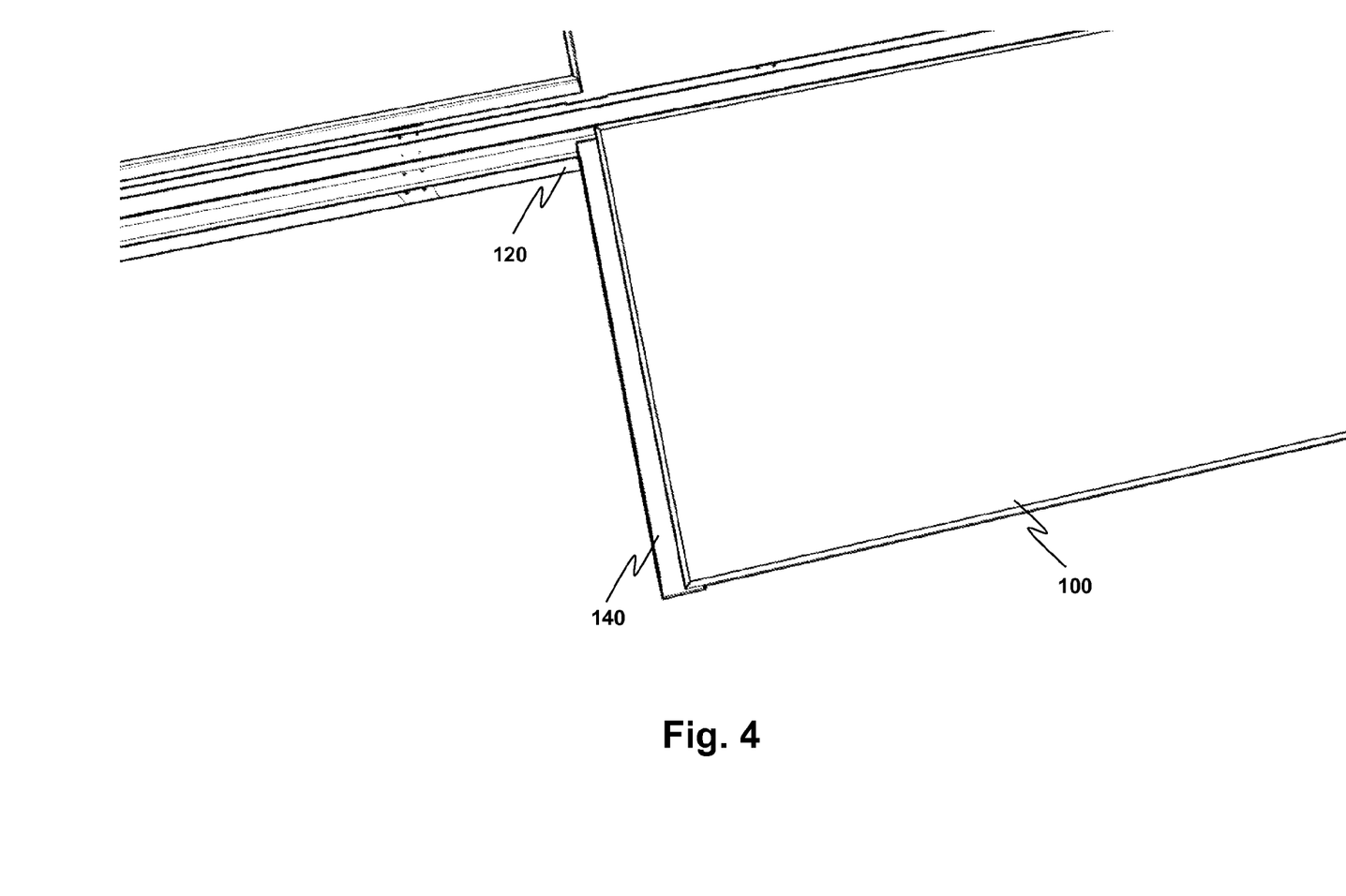
FIG. 4 is an isometric view similar to FIG. 3 except being viewed from the top.
Figure 5:
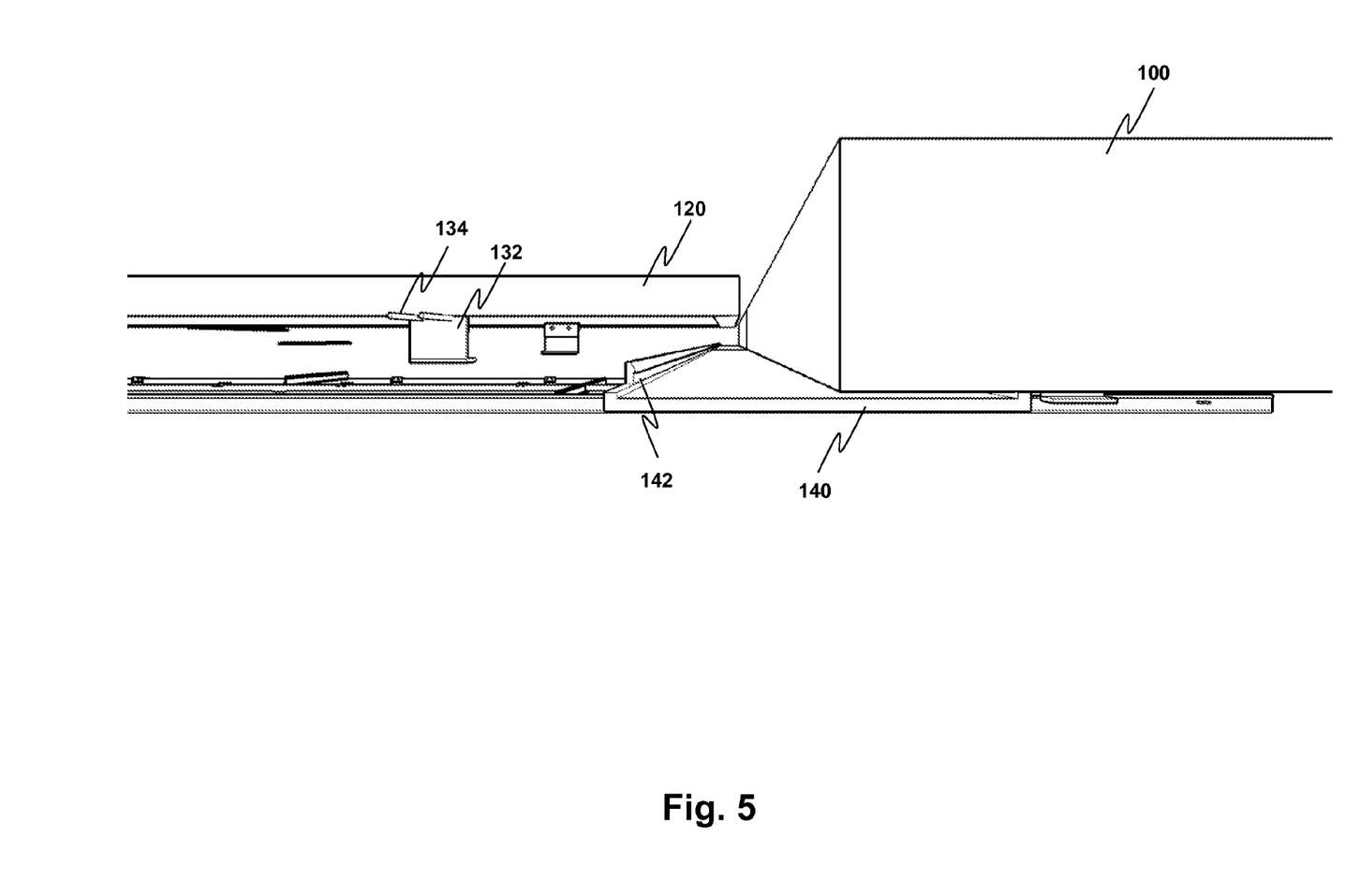
FIG. 5 is a view similar to FIG. 4 except that it is viewed from the side and more particularly illustrates the use of a connecting pan as a fastening clip, extending in the east-west direction.

FIG. 2 is an exploded isometric view of a portion of the present invention. In particular, in this view the placement of polymeric strips 112 and 122 are more easily seen since it is an enlargement as well as an exploded view. The relation between brackets 130 and 132 and their relative placement is also more easily seen in FIG. 2. Additionally, FIG. 2 illustrates the utilization of cylindrical structures 134 used to join two adjacent columns (modules) of solar panels together. These cylindrical structures may be bolts, posts, pins, or screws or any other convenient fastening device. Just as importantly, FIG. 2 illustrates the presence of connecting pan 140. This pan is also preferably used as a clip which provides additional structural rigidity along with providing a grounding function between photovoltaic solar panels. Its function as a clip is more easily appreciated in FIG. 5 discussed below. Nonetheless, it can be seen that connecting pan (or clip) 140 extends at least partially over the open portion of J-shaped channel supports 110 and 120. In this manner any water flow present between solar panels in the same assembly is directed into the main drainage channels provided by J-shaped support structures 110 and 120. For clarity's sake, it is noted that connecting pan 140 shown in FIG. 2 is in fact associated with a pair of solar panels disposed in an adjacent column or assembly. A different view of connecting pan 140 is seen in FIG. 3. This view shows connecting pan 140 from the bottom with one of the adjacent panels removed. It also indicates the possibility of providing notch 121 in J-shaped channel 120. In either case it is seen that the ends of connecting pan 140 are disposed so that they lie over the open channels in the J-shaped supporting structures. This ensures drainage from the east-west joints into the channels that run down between the north-south joints. (Again, for the sake of clarity and understanding it is noted that these joint directions are entirely relative and are described this way to be in keeping with the language of the solar arts.) Another view of connecting pan 140 is also provided in FIG. 4. More importantly, however, for completely understanding the operation of the present invention, the view in FIG. 5 is provided. In this figure it is to be particularly noted that connecting pan 140 is provided with notched and pointed vertical portion 142. This vertical portion extends across at least a portion of connecting pan 140 and it is seen that it functions as a mechanical clipping device holding adjacently disposed solar panels together in the columnar assemblies.

An alternate embodiment relative to connecting pan 140 separates the single piece shown into a flat pan 210 with polymeric gasketing 214 above it running lengthwise or east-west at the center point of its width and in two parallel lines on either side to further seal beneath the lower horizontal flange of each panel's east-west frame side. A separate clip 212 wraps from the inside edge of the module frame's lower horizontal flange over the flat pan to the adjacent module's corresponding inside edge, thereby trapping the pan against the lower flange and squeezing the two modules toward each other for a tight fit against the gasketing.

The present invention also works very well if the total installed array is designed as a series of sub-arrays, where adjacent sub-arrays are each a single plane, but with each being oriented first to the east with its west edge highest and the next sub-array's highest edge touching or connected to the first on its east side with the west edge lowest and the next pair of sub-arrays similarly oriented. With lower assembly cost, this secondary design is seen to be somewhat more common and has the advantage of creating a "flatter" output curve over the course of a day with more output in the early morning and later afternoon and somewhat less output in the middle of the day. This output curve mimics that of actively sun-oriented "tracking" module mounting systems that keep a single-planar array pointed at the sun as it is moved, either through motors and/or actuators, and pivots either on one or two axes. The present invention preferably used as a fixed-plane array, but can be deployed in this fixed "east-west" sub-array manner to facilitate the above described design so as to allow fixed arrays to have a differently shaped output over the course of each day.

In terms of a desired method of assembly, the present invention connects to the module frame first with an "L" shaped bracket 130, or "frame bracket" that has legs approximately equal in length and a hole in the approximate center of each leg. It is inverted such that one leg sits on the topside of the panel's bottom horizontal flange to allow a connecting bolt to be attached through the mounting hole. One inverted "L" bracket is attached at each mounting-hole location along the long sides of the panel that ultimately runs North-South in the unitized column of modules and the installed array of modules.

A second "L" shaped bracket, or "connecting bracket" 132, has a longer vertical leg and slightly shorter horizontal leg. It is attached so that the horizontal leg points toward the center of the module. The horizontal leg subsequently rests on east-west oriented purlins (or roof deck) of the structure below when the unitized column of modules is placed on the structure and it provides a hole or slot near its center to allow its mechanical connection (and in some installations, to a metal structure which also acts as an electrical grounding connection) to the structure below. This connection is made either through a vertical screw or bolt to guard against uplift forces due to wind or other forces. As best seen in FIG. 2, the topmost "outer" edge (that is, the edge away from the center of the module) of the vertical leg of L-bracket 132 is laid against the short vertical leg of its J channel and nearly touches the module frame bottom horizontal while the bottom of the frame bracket 130 horizontal leg extends over the top of connecting bracket 132 and the vertical leg of the frame bracket 130 continues downward over the top "inside" (towards the center of the solar panel) corner of the connecting bracket's vertical leg, functionally wrapping around it or trapping the top of its vertical leg and extending downward enough to provide sufficient structural strength at the point where aligned holes or slots in each vertical leg are next connected by horizontal bolt 134 through both of them as well as both sides of the north-south "J" channel 110 along with corresponding J-channel 120, connecting bracket 132 and frame bracket 130 of the next adjacent unitized column of panels.

One north-south J-shaped channel (110, 120) is attached to each side of a unitized column of panels. Its length is determined by the distance required to span from approximately ½" beyond the north-side (top) of the northern-most panel to approximately 2" beyond the south-side (bottom) of the southern-most module. Support and channel structures are shaped like the letter "J" and similarly oriented with their two unequal length legs rising vertically from a bottom connecting side that is flat towards its center and has a slightly rounded 90° transition to each of the vertical legs. The shorter leg is the same height as the vertical leg of connecting bracket 132 and upon assembly, the "outside" edge of the shorter vertical leg actually touches the inside edge of the module frame's bottom horizontal flange and the outside facing side of the connecting bracket's vertical leg lays against the J-shaped channel's short leg's surface facing the center of the module, substantially as shown in FIGS. 1 and 2.

The taller leg is taller by approximately ⅔ the height of the module frame's vertical leg, which allows the top edge of this taller leg to sit below the top surface of the module, creating a recessed appearance and visually de-emphasizing the J-channel in the installed array of panels, while all brackets are completely hidden beneath the panels. In addition to the visual benefit of having the top surface of the modules be almost the only thing seen from above, the complete lack of any top-down fasteners facilitates the melting of snow and shedding of any dirt and debris that may periodically accumulate on the finished array, thereby maximizing the array's electrical output.

Each side of the taller leg has weather-proof elastomeric or rubber material, 112 and 122 in FIG. 2, affixed by means of adhesive: the "inside" face (toward center of module) of the tall leg has a spaced series of short pieces that provide a consistent spacing and pressure between the module frame's outside vertical side and the J-shaped channel's inside, while along the length of the J-channel 110 and 120 between these "spacer" pieces, no material exists and water is able to drain from the surface of the modules into the center of the J-shaped channel unimpeded. As modules expand and contract, this movement and the pressure it creates is accommodated by the changing shape of the elastomeric material. The outside face of the J-channel's taller leg has a similar strip of elastomeric material running its entire length either toward the top of tall leg (see reference numeral 122) or toward the bottom of it (see reference numeral 112). In one embodiment, the placement of this continuous strip alternates between high and low on each adjacent piece of J-channel such that when two pieces of J-channel are connected together with their "outside" (away from center of module) "back-to-back," the two strips land one above the other in the same vertical plane rather than rest directly on one another. Similar to the inside face's elastomeric "spacers," the outside's continuous strips maintain a consistent pressure between the tall legs of adjacent J-channels as they are ultimately fastened together by horizontal through bolts 134. They also provide a structure for preventing any moisture or water that gets in between the adjacent, fastened-together J-channels from reaching the structure below the bottom of the J-channels and modules, instead creating a very shallow channel along which water flows downward and outward to the "south end" of the entire assembly. Any water that somehow gets through the top line of the elastomeric material between the adjacent J-channels would mostly likely become similarly trapped and conducted to the bottom of the assembly by the lower strip of elastomeric material, thereby acting as a second, redundant line of water management. The J-shaped channel pieces also have holes or slots through the shorter and longer vertical legs that are aligned along their length to allow "through bolts" to pass through them as well as the frame and connecting brackets on the inside of each shorter leg. Importantly, an installer may vary the relative tightness of through bolts 134 as a means of creating final alignment of modules 200 and the entire installed array.

Through bolts 134 are oriented horizontally and sized sufficiently long to span from the inside (toward center of module) surface of the vertical leg of the frame bracket through the thickness of the connecting bracket which it overlaps, through the total width of the short J-shaped channel leg, the long J-shaped channel leg and the elastomeric material on the outside of the long J-shaped channel leg and on through the adjacent J-shaped channel, connecting bracket 132, and frame bracket 130. There are either one or two through bolts per set of brackets along the length of the J-shaped channel as structural engineering requires for any given module design to which the system is adapted. The drawings herein show two through-bolts per bracket as a means of illustrating this design, but more often it will be one bolt per set of brackets.

Figure 10:
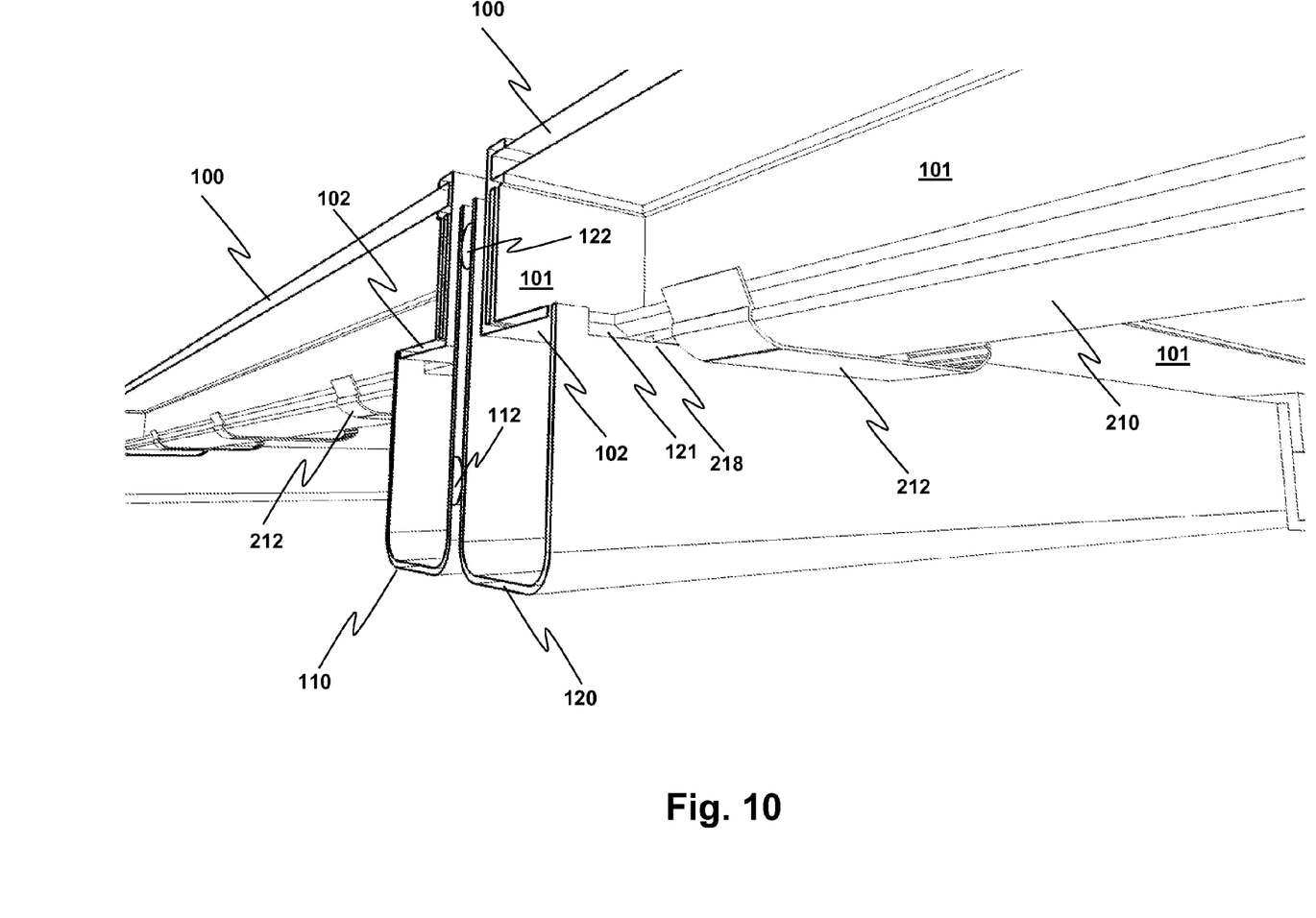
FIG. 10 is a view similar to FIG. 2 except that it more particularly illustrates the placement of the "horizontal" strips or pans with respect to a notch present in the shorter vertical portion of the J-Channel structures.

The top edge of each J-channel's shorter leg may be cut down in height along its length at the point where the top and bottom ends of each module's bottom frame horizontal flange 102 require it. This notch in the J-channel's edge is of sufficient depth to allow an East-West connecting pan clip to be accommodated along with the adjacent modules frames to sit on it and also at the correct height on top of the through-bolts. See notch 121 in FIG. 3. East-west connecting pan 140 is preferably both a pan and a clip in that it has a wider flat bottom surface and very short vertical legs that are machined to fit inside the module frame's bottom edge 102 at its north and south module frame sides and receive and hold these edges with pressure toward each other. See FIG. 5 in particular. In the preferred embodiment there is no elastomeric material between adjacent north and south module's frame's vertical sides or bottom sides, but by adding slightly to the connecting pan clip's width and its vertical side's height, elastomeric material could be accommodated if it were desirable to insure a higher degree of water management. In the alternative embodiment of connecting pan 140, where the pan and clip functions are served by separate pieces, elastomeric material is very much desired. The length of east-west pan clip 140 is sufficient for any given module such that it will overhang the inside of each J-channel's shorter leg on either side of it, thereby conducting any water that gets in-between adjacent modules' north and south ends to the attached J-channels. In all cases, as shown in FIG. 10, a shallow notch 218 in the bottom of pan 140 or pan 212 aligns with, spans and overhangs the notch 121 in the J channel upon which it rests.

Figure 6:
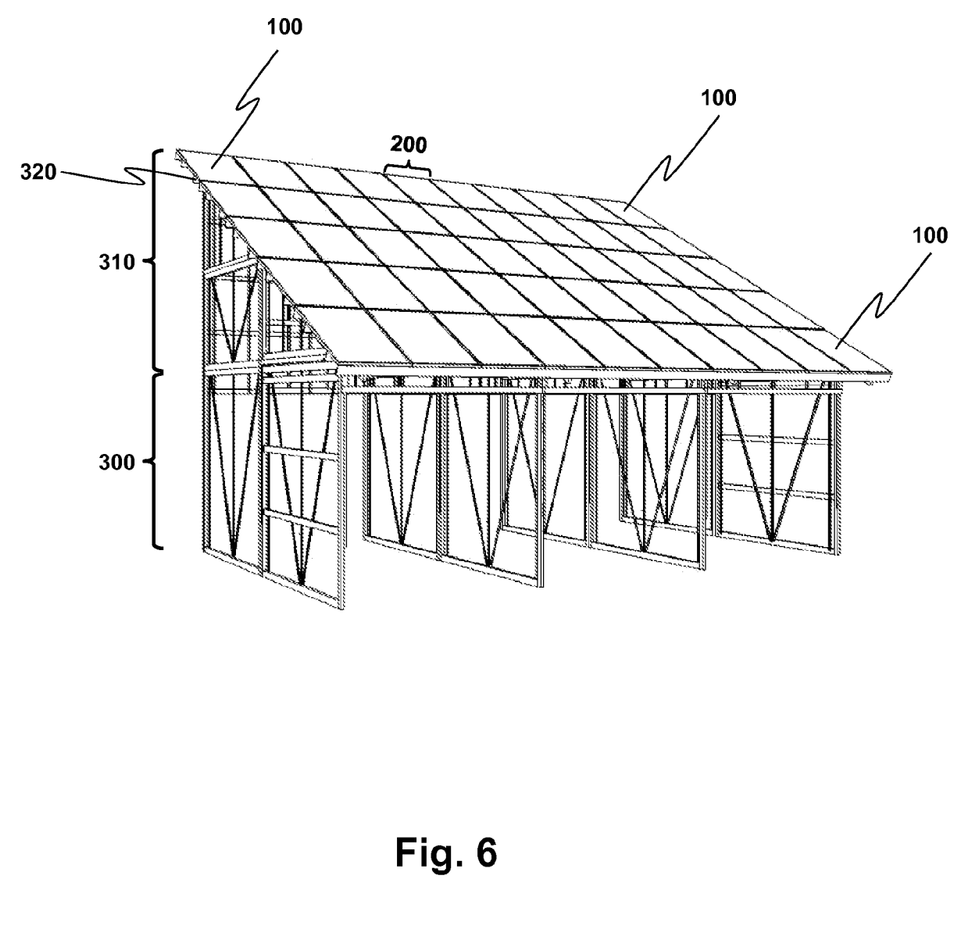
FIG. 6 is an isometric view illustrating an exemplary structure on which the roof of the present invention may be deployed.

It is noted that the present invention is particularly designed for use on a supporting structure which provides access to the underside of the solar panels and their assemblies. Such a structure is shown in FIG. 6. This structure is particularly advantageous in that it is constructible in a modular fashion. Relatively square side portions are stacked vertically to provide a desired height. Separately disposed triangular portions are selected to provide a desired installation angle for the solar panels. From the point of view of manufacturing and processing, this configuration requires fewer part numbers and enables a significant portion of the assembly to be carried on off-site, such as in a pre-fabrication facility.

Structures such as those shown in FIG. 6 are seen to be particularly usable in several different situations. In one configuration, the modular portions are sized and spaced so as to provide a structure such as a car port. In yet other configurations, the structures shown in FIG. 6 are deployed in parking lots and as overhead sidewalk coverings. The present invention, particularly as shown in FIG. 6, may also be employed as a patio covering or as part of another structural architectural component of a home, office, factory, hospital, train station, airport terminal, promenade, walkway or other structure.

FIG. 6 shows a view of a completed 3-bay car port-type structure with ten (10) modules 200 affixed side-by-side from east to west, each module consisting of five (5) solar panels 100 arranged one above the other and attached on their long sides by a plurality of brackets both to a left and right side J-channels and to purlins 320 (exemplary one referenced) of the structure that run east-west below them. The ten modules make up the roof surface entirely—there is no decking material or waterproofing layer between them and the structure's roof purlins. This is a preferred embodiment of the invention because the structure allows access from below for easy attachment of the connecting brackets to the purlins. The structure itself is composed of solid or hollow section structural elements made of wood, steel, or aluminum in accordance with local demands and owner preferences.

It is also noted that the base structure in FIG. 6, which is designed to support the solar panels, is preferably configured in two sections stacked vertically. Lower section 300 is intended to provide height adjustment while upper section 310 is intended to provide slope or angle adjustment so as to more directly face the array into the sun. An alternative embodiment is to have these sections 300 and 310 fabricated as a single piece if the final structure's dimensions allowed it and if it fit within the limits imposed by transport vehicles and/or transport routes.

It has been noted above that the solar panel assemblies of the present invention may also be deployed on an existing roof structure. FIG. 6 discussed above illustrates a structural configuration in which access to the underside of the assembly is easily provided since there is assumed to be no already existing roofing structure. However, in the event that it is desired to deploy the present system on an existing roof structure, prior to raising the modules shown into position for mounting, it is only necessary to affix screws, bolts, posts (with or without spacers) to bracket or bracket portion 132. This affixation is carried out using any conventional mechanism including the use of welding, adhesives or nuts. These screws, bolts, posts, etc. are aligned with pre-existing holes provided in the existing roofing structure. In such a configuration, it is noted that the ends of the J-channels are then preferably disposed over an existing gutter or other water drainage configuration.

Figure 7:
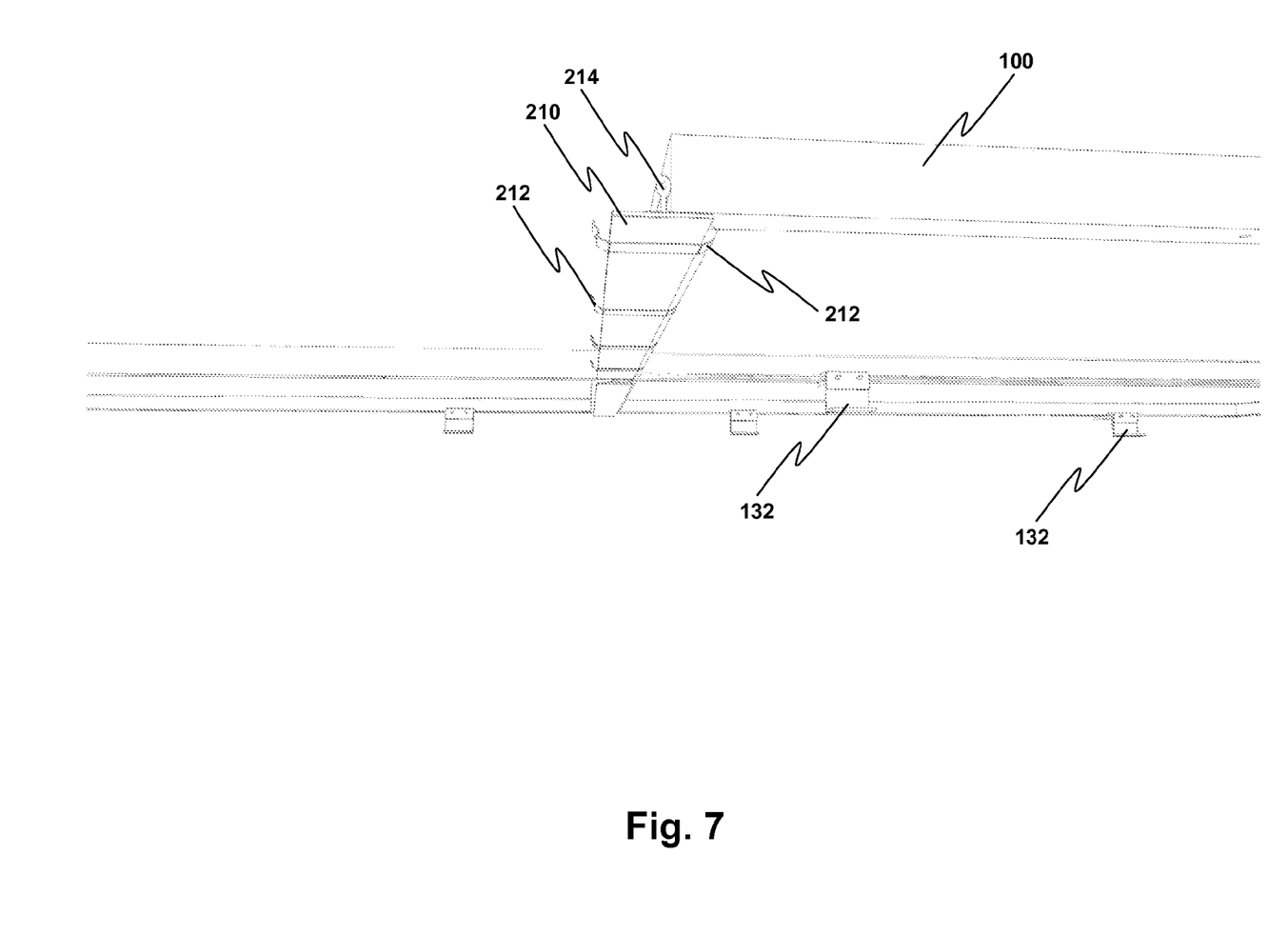
FIG. 7 is an isometric view from below of an alternative embodiment of the present invention in which the "horizontal" spaces between panels is provided with a T-shaped elastomeric material as part of the water runoff control.

An alternate embodiment of a connecting structure such as pan 140 is illustrated in FIG. 7. In this embodiment, instead of a single pan structure such as 140, there are provided separate structures 210 and 212. In this embodiment structure 210 is provided as a single flat strip preferably comprising a material such as aluminum. This is easier to manufacture than pan structure 140. In addition to strip 210 there are provided separately formed clips 212 as shown in FIG. 7. Provided above strip 210 there is provided separate polymeric gasketing 214 running "horizontally" or east-west (as discussed above). Separate clips 212 wrap from the inside edge of module (100) frame's lower horizontal flange 102 over flat pan 210 to the adjacent module's corresponding inside edge, thereby trapping the pan against the lower flange and squeezing the two modules toward each other for a tight fit against gasketing 214. A side view illustrating the relationship between the modules, the pan structure, the clips and the gasketing is illustrated in FIG. 8.

Figure 8:
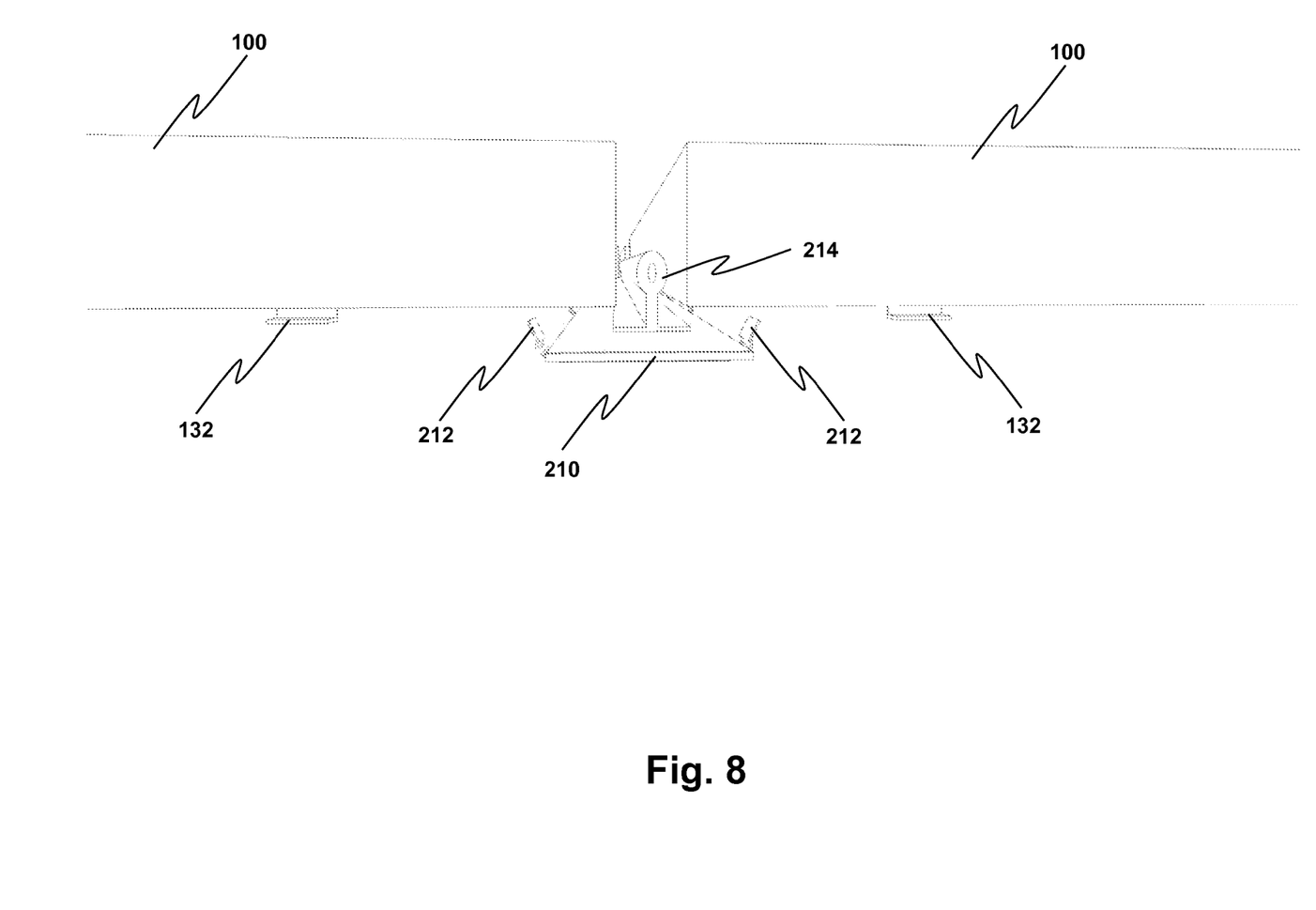
FIG. 8 is a view similar to FIG. 7 except that it is shown from more of a sideways viewpoint and is a partially exploded view.
Figure 9:
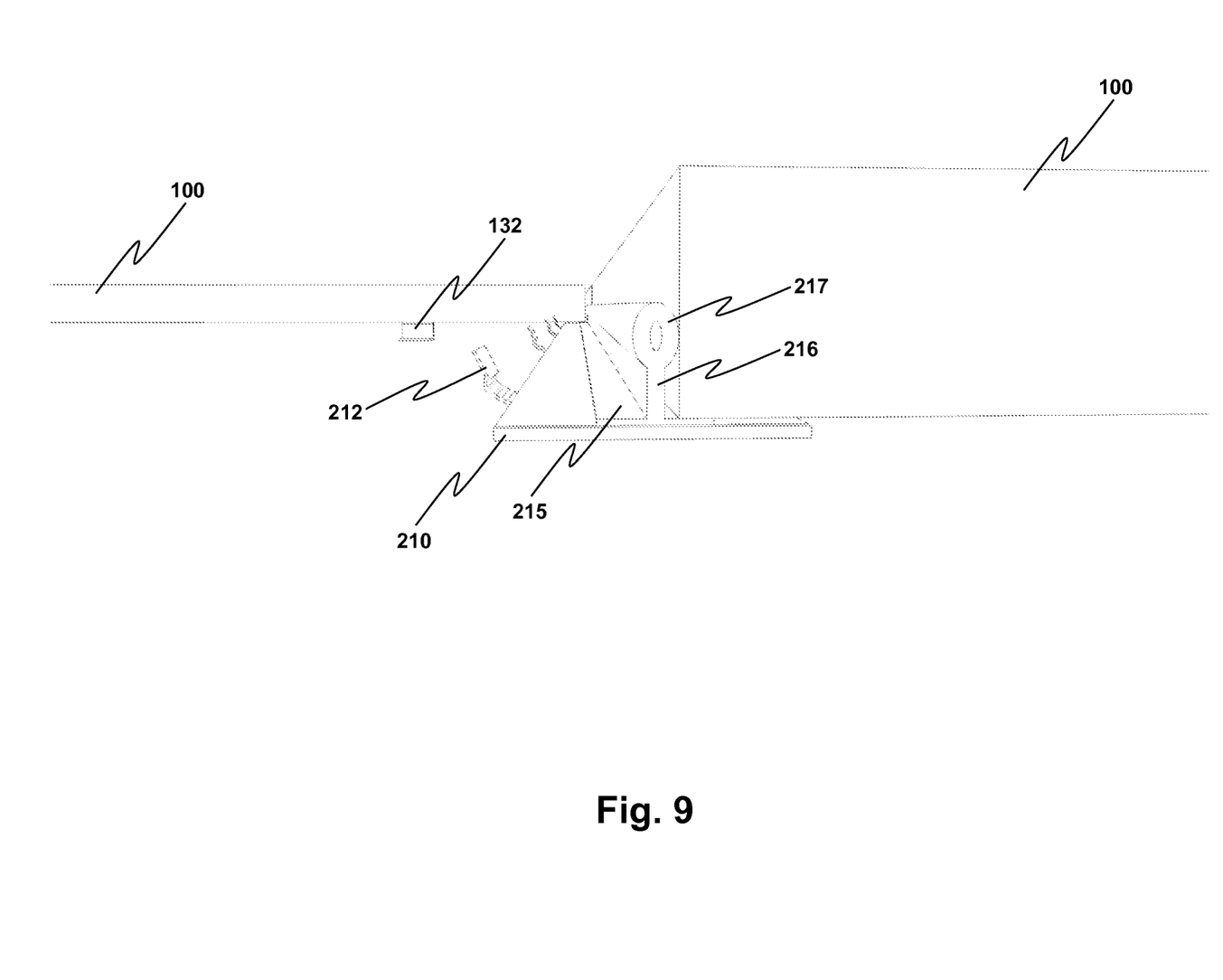
FIG. 9 is a view similar to FIG. 8 except that one of the panels from FIG. 8 is not shown so as to provide a better view of the clip structure.

FIG. 9 provides a more detailed view of the structure of gasketing material 214 and provides a view in which the leftmost panel of FIG. 8 is not shown so as to provide a better view of the clip structure and positioning when assembled. In FIG. 9, it is seen that gasketing material 214 comprises three parts: a flat strip 215 which rests against pan 210, a vertical stem structure 216; and a bulbous hollow portion 217 which seals against the edges of the modules frame edges in operation. This provides a seal beneath the lower horizontal flange of each panel's east-west frame side.

FIG. 10 is an isometric view similar to those shown above but here more particularly illustrating notch 121 in J channel 120 and corresponding notch 218 intended to accommodate actual or potential flows of water from pan 140 (FIG. 2 or 3) or strip 210 (FIG. 7). Furthermore, as indicated above, the present invention is intended to be employed with framed solar panels in which there is a substantially horizontal inwardly extending frame edges 102. Also shown in FIG. 10 is the vertically extending portion 101 of the panel frames. It is also noted that foreground clip 212 is shown in a position in which it is about to be snapped into place so as to engage the aforementioned inwardly extending horizontal frame edges 102, thus serving to more securely connect panels in the same "column."

Figure 11:
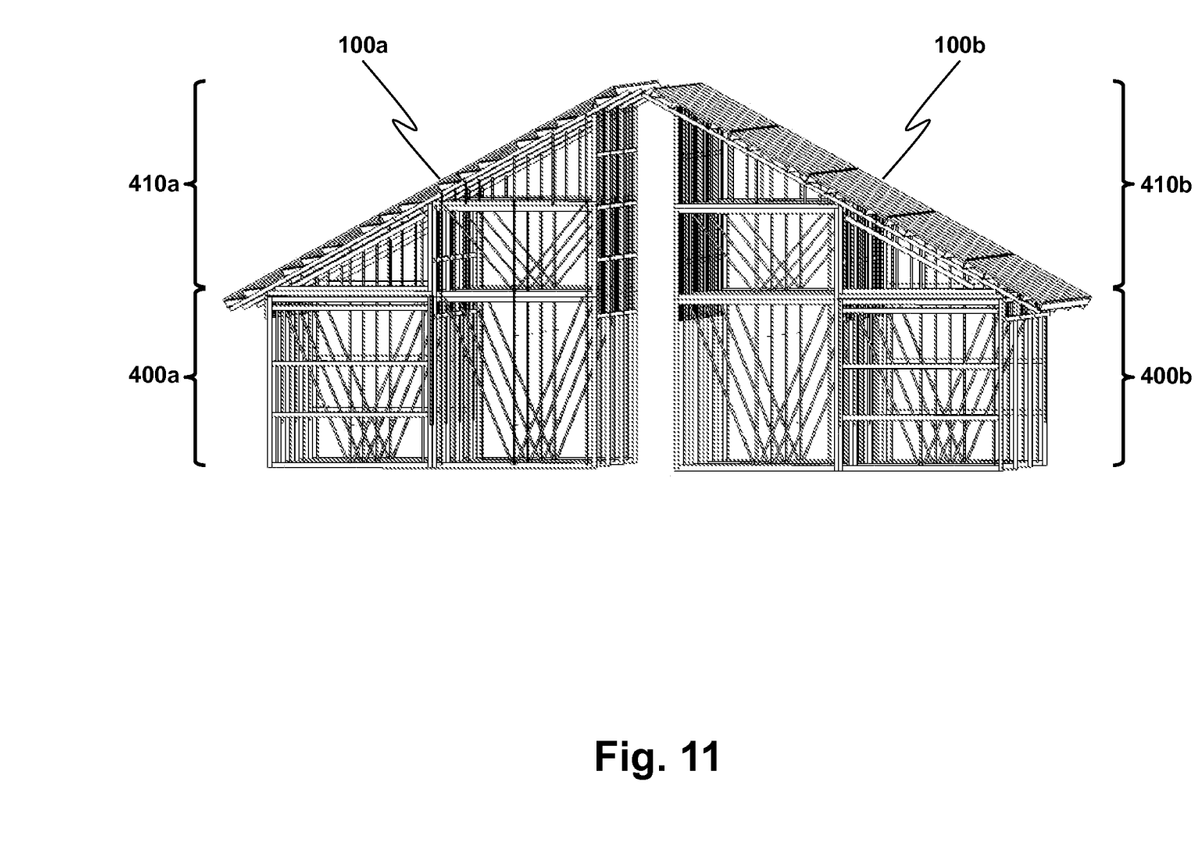
FIG. 11 is a view similar to FIG. 6 except that it illustrates a pair of structures like the one shown in FIG. 6, but typically arranged in an east-west orientation to capture maximum insolation with both the rising and setting sun.

FIG. 11 is an extension of the illustration shown in FIG. 6. In particular, FIG. 11 illustrates two structures similar to the one shown in FIG. 6 arranged in a back-to-back fashion. In this configuration the uppermost portion or the "ridgeline" of the structure shown is generally intended to be oriented in a north to south direction. In the configuration shown, one set of solar panels is intended to better capture morning insolation from the rising sun while the other set of solar panels is intended to better capture insolation delivered by the setting sun. Like FIG. 6, each of the structures preferably have bottom portions 400a and 400b preferably provided separately from the portions above. These lower structures are intended to have a consistent width, but through varied height, provide overall structures having differing heights. In contrast, upper structures 410a and 410b are provided separately in order to provide different slopes for solar panels 100a and 100b, as shown. A great number of final overall dimensions are created efficiently because the upper and lower sections are smaller than a single section and are individually variable with less material and inventory cost. Typically installation at different latitudes and in different surroundings suggest the use of differing slope angles. These adjustments are intended to improve solar performance in accordance with latitude and also to provide sufficient elevation under the array to allow the space below to be useful to a variety of purposes benefitting from shade and shelter from the weather.

It is noted that some of the claims herein refer to "columns." Depending upon the orientation and configuration of the solar panels employed herein, it is noted that it would have been equally appropriate to refer to "rows." Accordingly, the claims herein should not be construed as being limited to "columns."

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

Although the description above contains many specifics, these should not be construed as limiting the scope of the invention, but as merely providing illustrations of some of the presently preferred embodiments of this invention. Thus, the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 USC §112, sixth paragraph, unless the element is expressly recited using the phrase "means for."

While the invention has been described in detail herein in accordance with certain preferred embodiments thereof, many modifications and changes therein may be effected by those skilled in the art. Accordingly, it is intended by the appended claims to cover all such modifications and changes as fall within the spirit and scope of the invention.

The invention claimed is:

1. A method for installing solar panels, said method comprising the step of:
assembling said panels into an integrated module having J-shaped channel supports distinct from said panels affixed to opposite sides of said solar panels, said J-shaped channel supports providing structural integrity to said integrated module and a structure for directing water to ends of said J-shaped channel supports, said panels having frames with inwardly directed frame edges on undersides of said panels for attachment of said J-shaped channel supports, so that a column of said panels is formed with said J-shaped channel supports extending beyond said solar panel frames with taller portions of said J-shaped channel supports being disposed distally from said frames and whereby adjacently disposed ones of said integrated modules have said taller portions of said J-shaped channel supports facing each other upon installation.

2. The method of claim 1 further including the step of moving said assembled panels to a point of installation as a unit.

3. The method of claim 2 in which said assembling occurs away from said point of installation and said assembled panel is transported to said point of installation.

4. The method of claim 3 in which a plurality of said assembled panels are transported together.

5. The method of claim 2 further including the step of disposing columns of said assembled panels adjacent to one another so that said J-shaped channels provide a drainage structure.

6. The method of claim 2 in which said point of installation is a roof.

7. The method of claim 2 in which said assembled panels form a roof structure by themselves.

8. The method of claim 1 in which said solar panels are selected from the group consisting of solar thermal panels and solar photovoltaic panels.

9. The method of claim 1 further including the step of connecting said panels in said column with a clip.

10. The method of claim 9 in which said clip is configured to provide drainage into said J-shaped channel supports.

* * * * *